(12) United States Patent
Alam et al.

(10) Patent No.: US 7,715,227 B2
(45) Date of Patent: May 11, 2010

(54) PROGRAMMABLE ROM USING TWO BONDED STRATA

(75) Inventors: Syed M. Alam, Austin, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 209 days.

(21) Appl. No.: 11/865,991

(22) Filed: Oct. 2, 2007

(65) Prior Publication Data

US 2009/0086524 A1    Apr. 2, 2009

(51) Int. Cl.
*G11C 11/50* (2006.01)

(52) U.S. Cl. ............................. 365/164; 365/51; 365/63

(58) Field of Classification Search ................... 365/63, 365/51, 94, 100, 103–105, 164, 166
See application file for complete search history.

(56) References Cited

U.S. PATENT DOCUMENTS

| | | | | |
|---|---|---|---|---|
| 2,872,664 | A * | 2/1959 | Minot ......................... | 365/105 |
| 5,835,396 | A | 11/1998 | Zhang | |
| 5,943,255 | A * | 8/1999 | Kutter et al. .................. | 365/94 |
| 6,541,312 | B2 | 4/2003 | Cleeves et al. | |
| 6,624,485 | B2 | 9/2003 | Johnson | |
| 6,646,912 | B2 * | 11/2003 | Hurst et al. ................. | 365/175 |
| 6,653,712 | B2 | 11/2003 | Knall et al. | |
| 7,160,761 | B2 | 1/2007 | Cleeves et al. | |
| 7,203,084 | B2 | 4/2007 | Lee et al. | |
| 2002/0157247 | A1 * | 10/2002 | Li ................................ | 29/840 |
| 2003/0007081 | A1 * | 1/2003 | Kwon et al. ................. | 348/247 |
| 2004/0155302 | A1 | 8/2004 | Zhang | |
| 2005/0087817 | A1 | 4/2005 | Zhang | |
| 2006/0097279 | A1 | 5/2006 | Zhang | |

FOREIGN PATENT DOCUMENTS

EP    1 376 594 B1    2/2006

OTHER PUBLICATIONS

PCT/US2008/074453 International Search Report and Written Opinion.
Chang, Meng-Fan et al.; "Via-Programmable Read-Only Memory Design for Full Code Coverage Using a Dynamic Bit-Line Shielding Technique"; Proceedings of the 2005 IEEE International Workshop on Memory Technology Design and Testing; 2005; 6 pp; USA.
Takahashi, N. et al.; "Three-Dimensional Memory Module"; IEEE Transactions on Components, Packaging, and Manufacturing Technology-Part B; Feb. 1998; pp. 15-19; vol. 21, No. 1; IEEE.
Bertin, Dr. C.L. et al.; "Evaluation of a 3D Memory Cube System"; Proceedings of Electronic Components and Technology Conference; Jun. 1993; pp. 12-15; IEEE.

* cited by examiner

*Primary Examiner*—Tuan T Nguyen
*Assistant Examiner*—R Lance Reidlinger
(74) *Attorney, Agent, or Firm*—Robert L. King; Michael J. Balconi-Lamica

(57) ABSTRACT

A read only memory implemented as a 3D integrated device has a first stratum, a second stratum, and bonded inter-strata connections for coupling the first stratum to the second stratum. The physical bonding between the two strata implements the programming of the read only memory. The stratum may be in wafer form or in die form. The first stratum includes functional active devices and at least one non-programmed active device. The second stratum includes at least conductive routing to be associated with the at least one non-programmed active device. The bonded inter-strata connections include at least one bonded programmable inter-strata connection for programming the at least one non-programmed active device and for providing conductive routing to the programmed active device. The two strata thus form a programmed ROM. Other types of programmable storage devices may be implemented by bonding the two strata.

14 Claims, 5 Drawing Sheets

US 7,715,227 B2

PROGRAMMABLE ROM USING TWO BONDED STRATA

BACKGROUND

1. Field

This disclosure relates generally to semiconductors, and more specifically, to semiconductor read-only-memories (ROMs) and the programming thereof.

2. Related Art

An integration technology known as 3D (three-dimensional) integration technology uses the stacking of layers of various types of circuits in a single integrated circuit in order to reduce the overall circuit footprint. One application of 3D integration technology is for semiconductor memories or memory plus logic circuitry. Such 3D technologies however involve complex semiconductor manufacturing techniques.

Read-only-memories (ROMs) that are programmable are commonly implemented in integrated circuits. Such memories are programmed either after manufacturing, known as field programmable, or during the manufacture of the memory and known as mask ROMs. One type of memory that is programmed after manufacturing is a field programmable memory and typically uses fuses or antifuses. Field programmable memories require additional circuitry that is not needed in mask ROMs and the extra circuitry consume circuit area and increase cost. For example, implementing the field programming involves high programming voltages. Additionally the field programming is slow and consumes significant test equipment time. Memories that are programmed during manufacture by use of a programming mask avoid the expense of the slow programming of field programmable ROMs. A disadvantage however is that the integrated circuit is analogous to a custom integrated circuit and requires unique processing and handling. Inventory control must therefore be more carefully monitored for this type of product. Additionally, the amount of manufacturing time between the mask programming step of ROMs and the completion of the integrated circuit may be an issue to customers if the programming occurs relatively early in the manufacturing process.

In order to increase the packaging density associated with semiconductor memories, others have implemented multiple chip memory modules. Such modules are typically formed of dynamic random access memories (DRAMs) which are not programmable. If programmable memories are implemented, such memories are typically FLASH memories. However, FLASH memory modules have a significant cost as compared with ROM and have less data security than ROM products.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
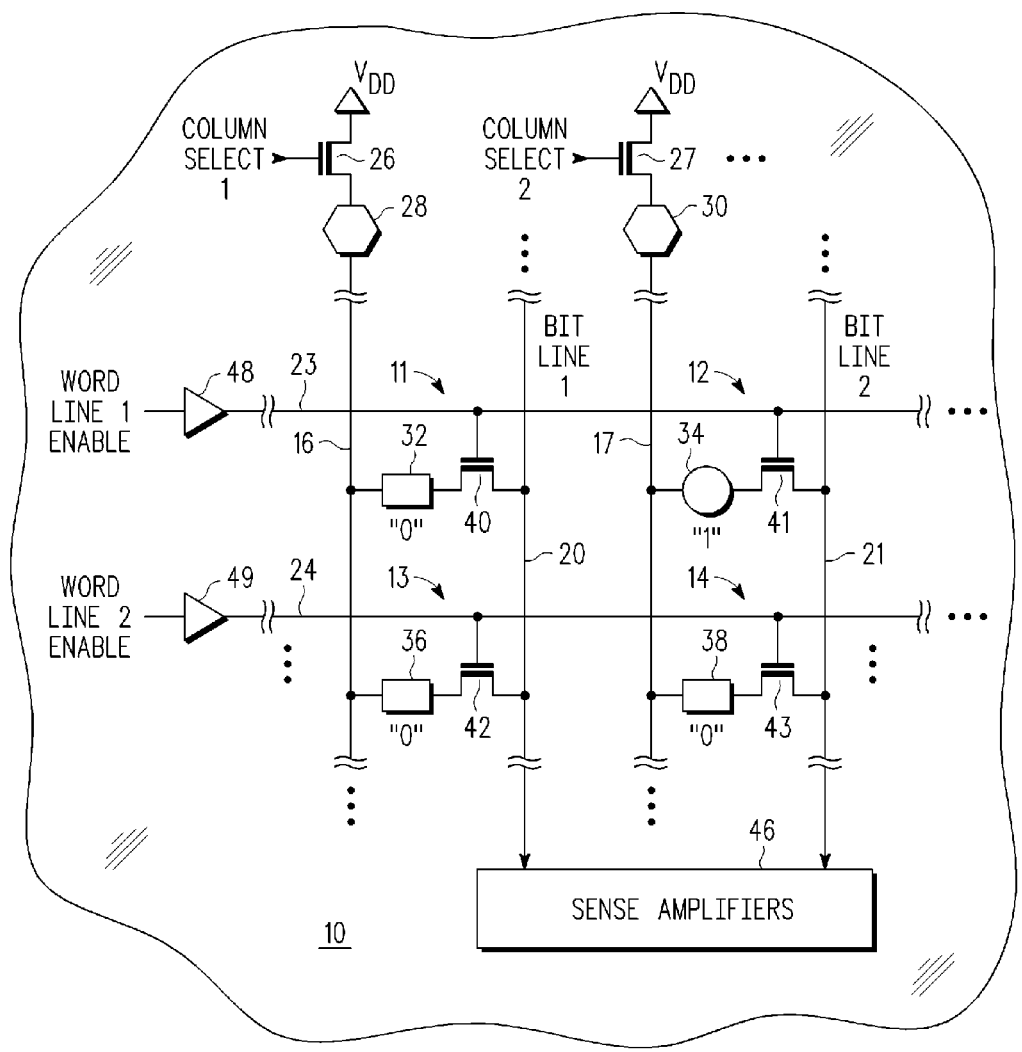
FIG. 1 illustrates in partial schematic form a read only memory (ROM) which is programmed in accordance with the present invention.

Illustrated in FIG. 1 is a schematic of a read only memory or ROM 10 having an array of memory cells such as memory cells 11, 12, 13 and 14. In one form the ROM 10 is a portion of additional circuitry such as a processor, logic circuitry, control circuitry, etc. on an integrated circuit which is commonly referred to as a system on chip (SOC). The ROM 10 in another form may be a standalone memory integrated circuit. Each memory cell is implemented as an access transistor. For convenience of illustration only a portion of a large number of memory cells arranged in a symmetrical array of rows and columns is implemented. Within the ROM 10 is a plurality of column select lines, such as column select line 16 and column select line 17. There is also a plurality of word lines, such as word lines 23 and 24, which are orthogonal to the column select lines. Within the ROM is a plurality of bit lines, such as a first bit line 20 and a second bit line 21. The bit lines 20 and 21 are orthogonal to the word lines. Each of the bit lines, including bit lines 20 and 21 are connected to respective inputs of sense amplifiers 46. A column select transistor 26 is an N-channel transistor and has a drain connected to a supply voltage labeled $V_{DD}$. A gate of column select transistor 26 is connected to a first column select signal labeled "Column Select 1". A source of column select transistor 26 is connected to a connected inter-strata connection 28. The connected inter-strata connection 28 is designated by a hexagonal shape meaning that the connection physically connects two separate strata. As used herein the term "stratum" designates an integrated circuit wafer, an integrated circuit die or other type of substrate for supporting circuitry. The inter-strata connection 28 is connected to the column select line 16. A column select transistor 27 is an N-channel transistor and has a drain connected to a supply voltage labeled $V_{DD}$. A gate of column select transistor 27 is connected to a second column select signal labeled "Column Select 2". A source of column select transistor 27 is connected to a connected inter-strata connection 30. The connected inter-strata connection 30 is also designated by a hexagonal shape meaning that the connection physically connects two separate strata. The inter-strata connection 30 is electrically connected to the column select line 17. The column select line 16 is also electrically connected to an open programmable inter-strata connection 32. The open programmable inter-strata connection 32 is an inter-strata connection that is not connected, physically or electrically, between the strata. Therefore the open programmable inter-strata connection 32 is programmed to a "0". The column select line 16 is also connected to an open programmable inter-strata connection 36. The open programmable inter-strata connection 36 is also an inter-strata connection that is not connected, physically or electrically, between the strata. Therefore the open programmable inter-strata connection 36 is programmed to a "0". The column select line 17 is also connected to a closed programmable inter-strata connection 34. The closed programmable inter-strata connection 34 is an inter-strata connection which is connected physically to the same strata that each of the connected inter-strata connections 28 and 30 are connected to. Further the closed programmable inter-strata connection 34 electrically connects the column select line 17 and the drain of transistor 41. Therefore, the closed programmable inter-strata connection 34 is programmed to a logic "1". The column select line 17 is also connected to an open programmable inter-strata connection 38. The open programmable inter-strata connection 38 is an inter-strata connection that is not connected, physically or electrically, between the strata. Therefore, the open programmable inter-strata connection 38 is programmed to a logic "0". A transistor 40 is used to implement memory cell 11 and is an N-channel transistor. A drain of transistor 40 is connected to the open programmable inter-strata connection 32. A gate of transistor 40 is connected to the word line 23. A source of transistor 40 is connected to bit line 20. A transistor 41 is used to implement memory cell 12 and is an N-channel transistor. A drain of transistor 41 is connected to the closed programmable inter-strata connection 34. A gate of transistor 41 is connected to the word line 23. A source of transistor 41 is connected to bit line 21. A transistor 42 is used to implement memory cell 13 and is an N-channel transistor. A drain of transistor 42 is connected to the open programmable inter-strata connection 36. A gate of transistor 42 is connected to the word line 24. A source of transistor 42 is connected to bit line 20. A transistor 43 is used to implement memory cell 14 and is an N-channel transistor. A drain of transistor 43 is connected to the open programmable inter-strata connection 38. A gate of transistor 43 is connected to the word line 24. A source of transistor 43 is connected to bit line 21. A word line driver 48 has an input for receiving a Word Line 1 Enable signal. An output of the word line driver 48 is connected to word line 23. A word line driver 49 has an input for receiving a Word Line 2 Enable signal. An output of the word line driver 49 is connected to word line 24.

In operation, the ROM 10 is a programmable ROM which uses two strata to implement. The ROM 10 is programmable only once. Both of the strata are required to implement the programmed ROM via a bonding interface. The bonding interface between the two strata is the connection of the selectively closed programmable inter-strata connections and the connected inter-strata connections. The strata described herein may be implemented in various forms but are typically either a semiconductor wafer having multiple die or a semiconductor die. The functionality of ROM 10 will be briefly described. As programmed, when any of memory cells 11, 12, 13 and 14 are addressed, the previously programmed bit value illustrated in FIG. 1 will be sensed by sense amplifiers 46. For example, to address memory cell 12 the Column Select 2 signal is activated at the same time that the Word Line 1 Enable signal is enabled. Transistors 40 and 41 are both made conductive, whereas transistors 42 and 43 are not conductive. Additionally, the supply voltage $V_{DD}$ is connected via column select transistor 27, the connected inter-strata connection 30 and the closed programmable inter-strata connection 34 to transistor 41. Since transistor 41 is conductive a current flows in Bit Line 2 which is sensed as a logic "one" by the sense amplifiers 46. The programming of ROM 10 occurs after formation of the line drivers, the sense amplifiers, the memory cell transistors and the select transistors. In particular, the programming of ROM 10 occurs after a processing passivation step occurs over these formed devices. The passivation step is a covering of passivation material which protects the previously formed devices from subsequent processing and from environmental conditions. The programming of ROM 10 is implemented by forming connections or not forming connections between two strata depending upon whether an electrical connection is desired at a particular point in the ROM 10. For example, all memory cell transistors that are desired to be programmed to a logic "one" will have a closed programmable inter-strata connection adjacent the memory cell transistor such as closed programmable inter-strata connection 34. All memory cell transistors that are desired to be programmed to a logic "zero" will have an open programmable inter-strata connection adjacent the memory cell transistor such as open programmable inter-strata connections 32, 36 and 38. To complete the programming of ROM 10, the two strata are bonded together for coupling a first stratum to a second stratum. In one form a closed programmable inter-strata connection is implemented with a micropad. A micropad is a conductive bonding pad. In one form the micropad is made of a $Cu_3Sn$ alloy. In another form the micropad is made of copper or alloys thereof. In yet another form the micropad is made of gold or alloys thereof. Other metals and conductive materials may be used. In another form the closed programmable inter-strata connection is implemented with a through substrate via (TSV). Appropriate TSV materials include copper, tungsten, alloys thereof and other conductive materials including metals.

Figure 2:
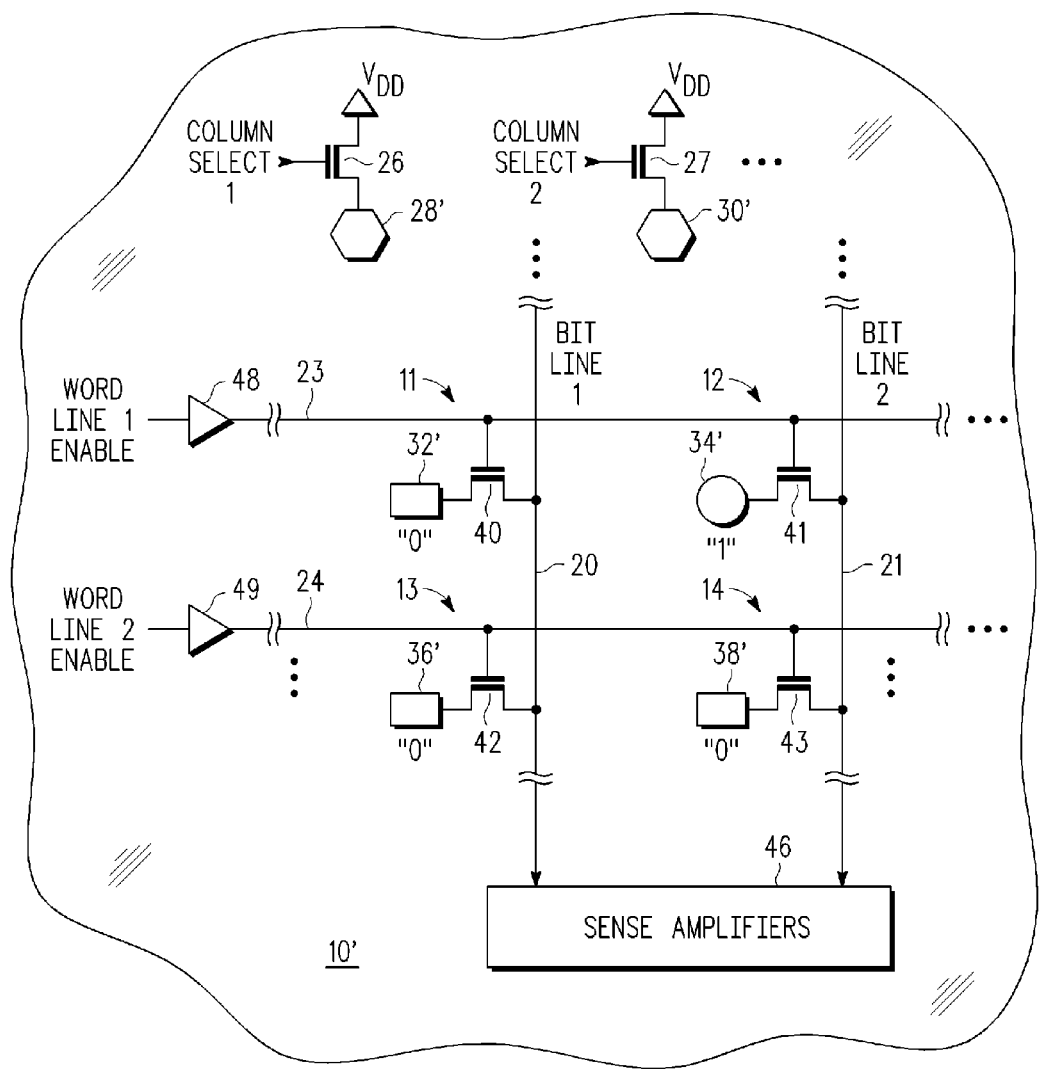
FIG. 2 illustrates in partial schematic form the portion of the ROM of FIG. 1 which is implemented in a first stratum.

Illustrated in FIG. 2 is the portion of the schematic of FIG. 1 which is implemented within a first stratum. The first stratum may be a semiconductor wafer or a semiconductor die, for example. Not all of the structural connections for the programmable ROM 10 are implemented and thus FIG. 2 illustrates ROM 10'. For convenience of comparison, the same elements in FIG. 1 and FIG. 2 are given the same reference numbers. In comparing ROM 10 with ROM 10' it can be seen that the column select line 16 and column select line 17 are not implemented. That is, the interconnect which electrically connects the connected inter-strata connections 28' and 30' respectively to the programmable inter-strata connections is not implemented in the first stratum of FIG. 2.

Figure 3:
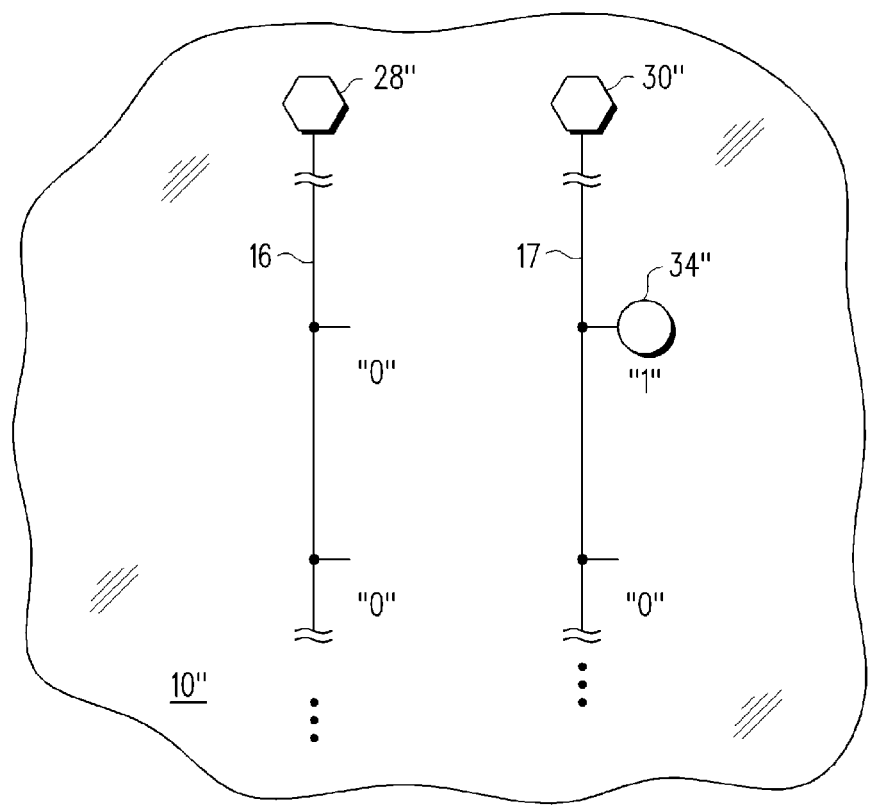
FIG. 3 illustrates in partial schematic form the portion of the ROM of FIG. 1 which is implemented in a second stratum.

Illustrated in FIG. 3 is the portion of the schematic of FIG. 1 which is implemented within a second stratum. The second stratum may also be a semiconductor wafer or a semiconductor die, for example. The remaining structural connections for the programmable ROM 10 are implemented within the second stratum and thus FIG. 3 illustrates ROM 10". For convenience of comparison, the same elements in FIG. 1 and FIG. 3 are given the same reference numbers. In comparing ROM 10 with ROM 10' and ROM 10" it can be seen that the column select line 16 and column select line 17 are implemented in ROM 10" of the second stratum. That is, the interconnect or conductors which make electrical contact from the connected inter-strata connections 28' and 30' respectively to the programmable inter-strata connections 32', 36' and programmable inter-strata connections 34', 38' occur in the second stratum illustrated in FIG. 3. Additionally implemented in the second stratum as can be readily seen in FIG. 3 are all inter-strata connections that are desired. Thus since memory cell 12 is desired to be programmed to a logic "one", a closed programmable inter-strata connection 34" is implemented. Since memory cells 11, 13 and 14 are desired to be programmed to a logic "zero", no closed programmable inter-strata connections are implemented in those memory cells in the second stratum. Since the connected inter-strata connections 28 and 30 are desired to be connected in ROM 10, the ROM 10" implements the connected inter-strata connections 28" and 30". Thus, the ROM 10" is implemented to complement the programming in ROM 10' according to a predetermined program.

Figure 4:
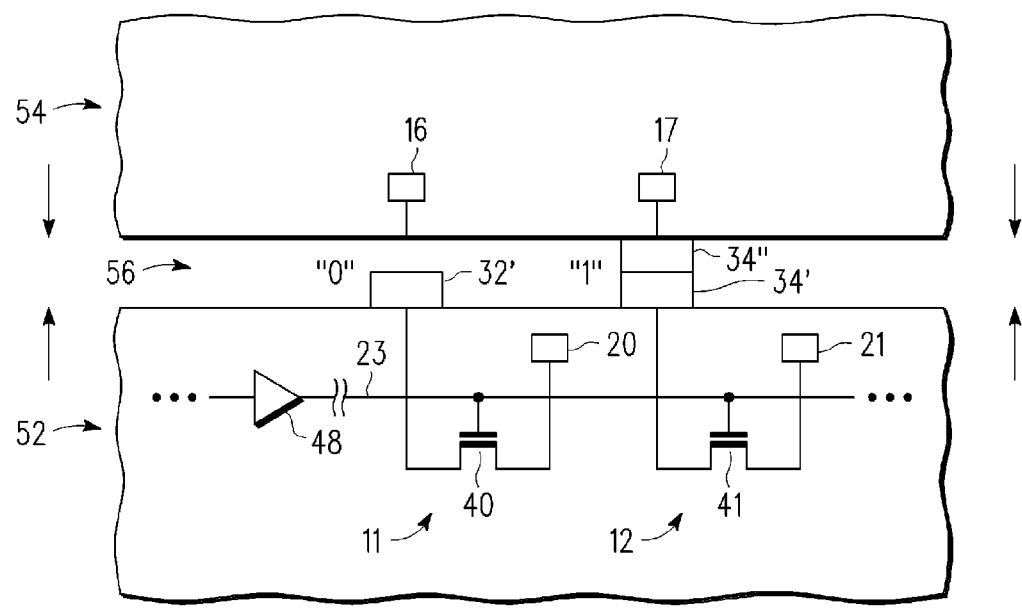
FIG. 4 illustrates in perspective form from a first direction the connection of a first stratum to a second stratum in accordance with a first embodiment to complete the programming of the ROM of FIG. 1.

Illustrated in FIG. 4 is a perspective view illustrating a connection of a first stratum 52 with a second stratum 54 to implement ROM 10 of FIG. 1 in a 3D integrated chip 50. For purposes of comparing FIG. 1 with FIG. 4, common elements are similarly numbered. As can be readily seen by the arrows in FIG. 4 the first stratum 52 is connected to the second stratum 54. A gap 56 exists between the two strata. This gap may be filled by a dielectric material (not shown) for enhanced structural integrity rather than leaving it as an air gap. Memory cell 11 which is illustrated as being implemented in the first stratum 52 is programmed as a logic zero. Therefore there is no electrical connectivity between the drain of transistor 40 in the first stratum 52 and the column select line 16 in the second stratum 54. In contrast the memory cell 12 is programmed as a logic one and there is electrical connectivity between the drain of transistor 41 in the first stratum 52 and the column select line 17 in the second stratum 54 via closed programmable inter-strata connections 34' and 34". In the view illustrated in FIG. 4 the column select lines 16 and 17 are illustrated as coming out of the plane of the illustrated view. Column select line 17 is connected to memory cell 12 since it is programmed as a logic "one", and column select line 16 is not connected to memory cell 11 since it is programmed as a logic "zero". Thus it can be readily seen in FIG. 4 that the connection of the first stratum 52 to the second stratum 54 has completed the programming of ROM 10. A passivation layer exists on at least the exposed surface of the second stratum 54. A passivation layer may also exist on the exposed surface of the first stratum 52. Because the passivation layer is very thin relative to the thickness of the first stratum 52 and the second stratum 54, the passivation layer is not given a reference number in FIG. 4 and the following cross-sectional illustrations. The inter-strata connection 34" is surrounded by passivation material and directly contacts the surface of the second stratum. In one form the passivation material is etched from the second stratum 54 in those areas where an inter-strata connection is located. The passivation layer is formed before formation of the inter-strata connections. As a result, formation of the inter-strata connections is not integrated into an early portion of the process flow associated with creation of the 3D integrated chip 50. Formation of 3D integrated chip 50 may thus occur in a wafer manufacturing facility with the programming subsequently done in a separate, post-manufacturing facility. The methods described herein permit more flexibility for various uses of the products manufactured at the wafer manufacturing site.

Figure 5:
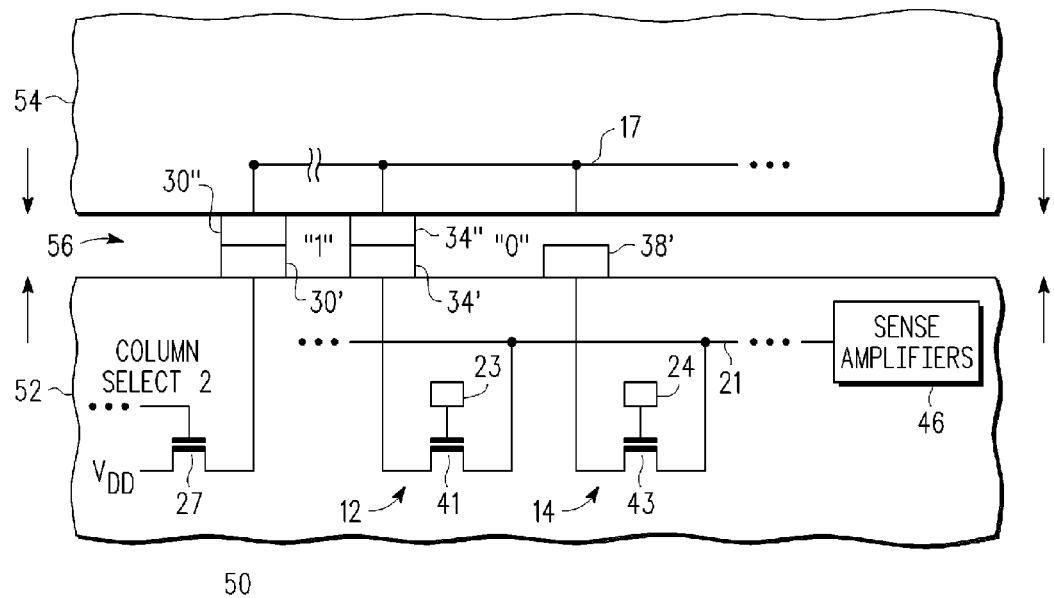
FIG. 5 illustrates in perspective form from a second direction the connection of the first stratum to the second stratum in accordance with the programming illustrated in FIGS. 1 and 4.

Illustrated in FIG. 5 is a second perspective view illustrating the connection of the first stratum 52 with the second stratum 54 to implement ROM 10 of FIG. 1 in the 3D integrated chip 50. For purposes of comparing FIG. 1 with FIG. 5, common elements are again similarly numbered. The arrows in FIG. 5 illustrate that the first stratum 52 is connected to the second stratum 54. From the view of FIG. 5 memory cells 12 and 14 are visible along with the column select transistor 27. Column select transistor 27 is illustrated as being connected to the connected inter-strata connection 30 which is collectively represented in FIG. 5 by 30' and 30". Similarly, memory cell 12 is illustrated as being programmed to a logic "one" by the component portions 34' and 34" of closed inter-strata connection 34. Memory cell 14 is illustrated as being programmed to a logic "zero" by having only component portion 38' and not a component portion 38" from the second stratum 54. Thus the gap 56 or a dielectric that fills gap 56 keeps transistor 43 from being electrically connected to column select line 17. Other active circuitry, such as sense amplifiers 46, is implemented within the stratum 52. In one form the stratum 52 is a semiconductor die and the active circuitry is implemented within a bulk substrate.

Figure 6:
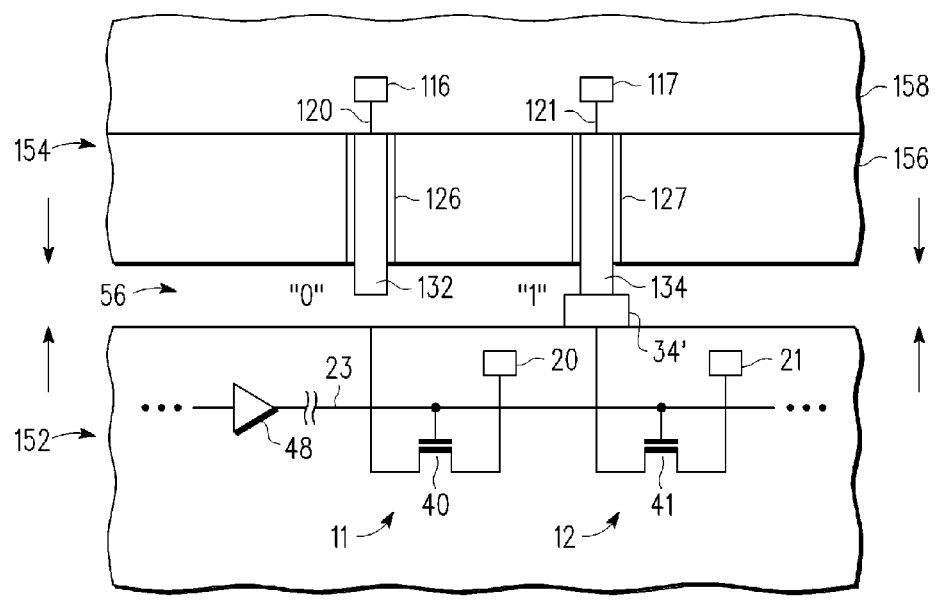
FIG. 6 illustrates in perspective form from a first direction the connection of a first stratum to a second stratum in accordance with a second embodiment to complete the programming of the ROM of FIG. 1.

Illustrated in FIG. 6 is another embodiment of a ROM programmed in accordance with the present invention. A ROM 150 has a first stratum 152 that is bonded to a second stratum 154. For convenience of comparison with the earlier discussion, elements in FIGS. 6 and 7 below which are similar to elements in FIGS. 1-5 are numbered the same. Instead of using micropads in the second stratum 154, the illustrated embodiment implements TSVs in the second stratum 154. The second stratum 154 has a substrate 156. In one form the substrate 156 is single crystal silicon, but other semiconductor materials may be used. Overlying the substrate 156 is an interconnect dielectric 158. In one form the interconnect dielectric 158 is an oxide but other dielectric materials may be used. Within the substrate 156 of the second stratum 154 is formed a plurality of TSVs such as through substrate via 132 and through substrate via 134. Adjacent to the through substrate via 132 is a dielectric 126, and adjacent to the through substrate via 134 is a dielectric 127. The through substrate via 132 is connected to a column line 116 via a conductive element 120. The through substrate via 134 is connected to a column select line 117 via a conductive element 121. The through substrate via 132 and through substrate via 134 are substantially the same length and extend from the second stratum 154 about the same amount. On the first stratum 152 is formed a closed programmable inter-strata connection 34' to permit electrical connection of the memory cell 12 associated with transistor 41 to column select line 117. The memory cell 12 is thus programmed to a logic one as a result of the bonding of first stratum 152 to second stratum 154. The memory cell 11 associated with transistor 40 is programmed to a logic zero as there is no electrical connectivity between the column select line 116 and transistor 40. It should be understood that additional conductive materials may be used in connection with the bond of the closed programmable inter-strata connection 34' and the through substrate via 134. Therefore, the programming of the ROM 150 is completed as a result of the bonding of two separate wafers or die.

Figure 7:
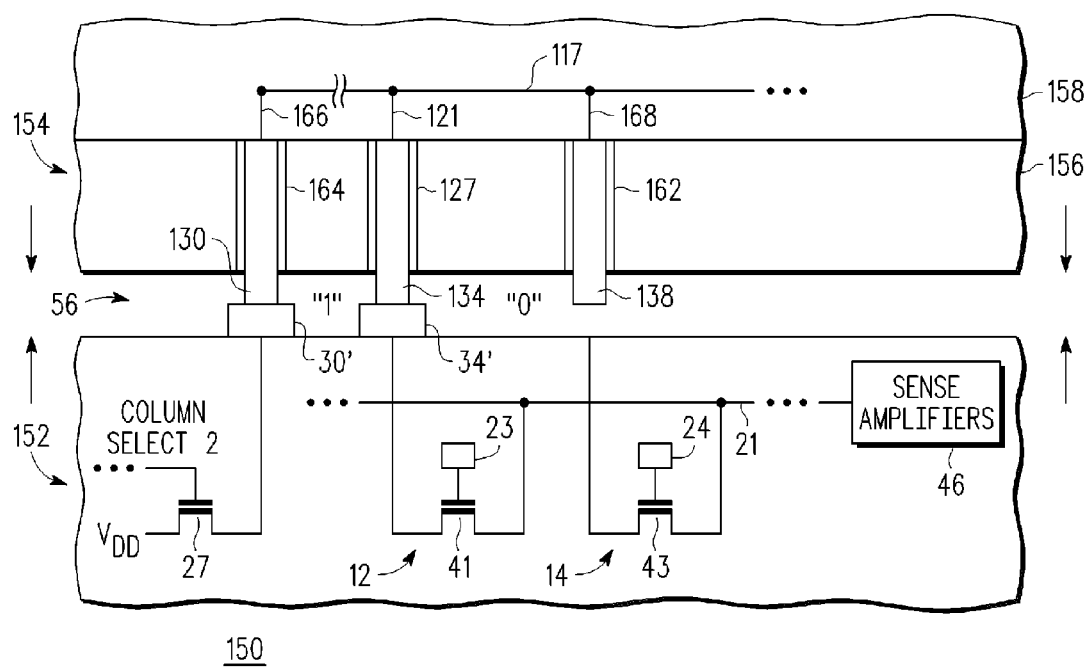
FIG. 7 illustrates in perspective form from a second direction the connection of the first stratum to the second stratum in accordance with the programming illustrated in FIGS. 1 and 6.

Illustrated in FIG. 7 is an alternate view of the ROM 150 wherein a portion of the length of the column select line 117 within the interconnect dielectric 158 of the second stratum 154 is visible. In this view a connected inter-strata connection is illustrated in addition to different views of transistors 41 and 43 and their connections. Within the first stratum 152 is additional active circuitry such as sense amplifiers 46. Through substrate vias 130 and 134 formed within the substrate 156 of the second stratum 154 make electrical connection with the first stratum 152 whereas the through substrate via 138 does not make electrical connection with the first stratum 152. Therefore, the memory cell 12 associated with transistor 41 is programmed a logic "one" and the memory cell 14 associated with transistor 43 is programmed a logic "zero". From this view it is apparent that both strata are necessary to complete the programming of ROM 150.

By now it should be appreciated that there has been provided a method for forming and programming a semiconductor memory, such as a mask programmable ROM. It should be understood that the micropads implemented in each of the strata can be used to program a ROM. In this way the micropads function as a mask for programming. In other embodiments the through substrate vias (TSVs) can also be used to program the ROM. The mask programming function provided by the micropads and the TSVs described herein may be implemented in only one of the two strata or in both strata.

For example, an open connection between the two strata may be implemented as a missing micropad or TSV in just one stratum or in both strata.

In one form there is herein provided a programmable read only memory. A first stratum includes functional active devices, such as the column select transistors 26 and 27, word line drivers 48 and 49 and sense amplifiers 46. The first stratum also includes at least one non-programmed active device, such as transistors 40-43 of memory cells 11-14. A second stratum includes at least conductive routing to be associated with the at least one non-programmed active device. The first stratum and the second stratum may both be semiconductor wafers. In another form the first stratum and the second stratum may both be semiconductor die. In yet another form the first stratum and the second stratum may both be groupings of plural die, such as die modules. Bonded inter-strata connections couple the first stratum to the second stratum. The bonded inter-strata connections include at least one bonded programmable inter-strata connection for programming the at least one non-programmed active device and for associating the conductive routing with the programmed active device. In one form the functional active devices include a plurality of column select transistors, a plurality of word line drivers and sense amplifiers. In another form the at least one non-programmed active device further includes an array of transistors located in the first stratum and forming a plurality of rows and columns, each transistor in the array of transistors having one current electrode that is electrically unconnected.

In another form the at least one bonded programmable inter-strata connection includes a closed programmable inter-strata connection or an open programmable inter-strata connection. In yet another form the closed programmable inter-strata connection represents a first logic state and the open programmable inter-strata connection represents a second logic state, the second logic state being different from the first logic state. In yet another form the closed programmable inter-strata connection includes a presence of a micropad connection, and an open programmable inter-strata connection includes an absence of the micropad connection at the bonding interface. In yet another form the at least one programmable inter-strata connection includes a bonded micropad connection. In another form the bonded micropad connection includes one selected from (i) a $Cu_3Sn$ (copper/tin) alloy bond, (ii) a Cu—Cu (copper/copper) bond, and (iii) a Au—Au (gold/gold) bond. In yet another form the programming of the at least one programmable inter-strata connection is defined by a mask patterning of micropads on one selected from the group consisting of the first stratum, the second stratum, and a combination of both the first stratum and second stratum. In yet another form at least one of the first stratum and the second stratum is a substrate having at least one through substrate via, and wherein the at least one bonded programmable inter-strata connection further includes either (i) a closed programmable inter-strata connection formed by a bonded micropad and through substrate via connection, or (ii) an open programmable inter-strata connection formed by an absence of a micropad and through substrate via connection at the bonding interface. In another form the first stratum includes the substrate having the at least one through substrate via coupled to the at least one non-programmed active device, and wherein the at least one bonded programmable inter-strata connection further includes the at least one non-programmed active device being programmed with use of the bonded micropad and the through substrate via. In another form the second stratum includes the substrate having the at least one through substrate via coupled to the conductive routing, and the at least one bonded programmable inter-strata connection further includes conductive material for programming the at least one non-programmed active device and for connecting the conductive routing to the non-programmed active device with the at least one through substrate via. In another form the first stratum includes a semiconductor wafer or a semiconductor die and wherein the second stratum includes a semiconductor wafer or a semiconductor die. In yet another form the functional active devices and the at least one non-programmed active device comprise portions of a system on chip.

In one form a programmed storage device includes a first stratum with functional active devices and at least one non-programmed active device. A second stratum has at least conductive routing to be associated with the at least one non-programmed active device. Bonded inter-strata connections couple the first stratum to the second stratum. The bonded inter-strata connections include at least one bonded programmable inter-strata connection for programming the at least one non-programmed active device and for associating the conductive routing with the at least one non-programmed active device. The at least one bonded programmable inter-strata connection includes one of a closed programmable inter-strata connection and an open programmable inter-strata connection. The closed programmable inter-strata connection represents a first logic state, and the open programmable inter-strata connection represents a second logic state. The second logic state is different from the first logic state. The closed programmable inter-strata connection includes a presence of a micropad connection. An open programmable inter-strata connection includes an absence of the micropad connection at the bonding interface. The first stratum includes at least one of a semiconductor wafer and a semiconductor die and the second stratum includes at least one of a semiconductor wafer and a semiconductor die.

In another form there is herein provided a method of forming a programmable storage device. A first stratum including functional active devices and at least one non-programmed active device is provided. A second stratum including at least conductive routing to be associated with the at least one non-programmed active device is provided. The first stratum is bonded to the second stratum using inter-strata connections. The bonded inter-strata connections include at least one bonded programmable inter-strata connection for programming the at least one non-programmed active device to become a programmed active device and for associating the conductive routing with the programmed active device. In another form a surface layer of at least one of the first stratum and the second stratum is passivated prior to bonding the first stratum to the second stratum. Therefore, programming of a ROM is able to occur after passivation and at a late stage in manufacturing. The programming is therefore less costly and generally faster than when done as a part of the manufacturing processing flow prior to passivation of the stratum. When through substrate vias are implemented on both strata as the bonded inter-strata connections no passivation on either stratum surface may be required. In another form the at least one bonded programmable inter-strata connection is formed as one of a closed programmable inter-strata connection or an open programmable inter-strata connection. The closed programmable inter-strata connection represents a first logic state and the open programmable inter-strata connection represents a second logic state. The second logic state is different from the first logic state. The closed programmable inter-strata connection includes a micropad connection and the open programmable inter-strata connection includes an absence of the micropad connection at a bonding interface between the first stratum and the second stratum. In one embodiment the bonded inter-strata connections further include bonded micropad connections. The bonded micropad connection in one form includes one selected from (i) a $Cu_3Sn$ alloy bond, (ii) a Cu—Cu bond, and (iii) a Au—Au bond. Other metal alloys may be implemented. In another form the first stratum is provided as either a semiconductor wafer or a semiconductor die, and the second stratum is provided as either a semiconductor wafer or a semiconductor die.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method may be used to form other mask programmable devices in addition to ROMs. By way of example only, mask programmable memory cells employing the teachings herein could be used in combination with other types of memory cells, such as fuses, antifuses, and flash nonvolatile memory cells. Such a combination could be within the same memory array or in different memory arrays on the 3D device. Further, in other forms a first stratum includes functional active devices, at least one non-programmed active device and at least one programmed active device. In such an embodiment the at least one programmed active device on the first stratum may be programmed using any of various known programming structures and methods. In this embodiment the at least one non-programmed active device on the first stratum may be used to provide enhanced security for a portion of the 3D device. The enhanced security is provided with the programmable ROM described herein because modification of the programmed code in the ROM is not possible without destroying the structural integrity of the 3D device. For many applications using programmable ROM, such as in automotive microcontrollers, it is very important for safety and reliability that a manufacturer's program stored in a ROM not be susceptible to modification. In yet another form there may be functional active devices on both the first stratum and the second stratum that become functionally connected when the two strata are bonded together. Techniques may also be applied where necessary to implement a first portion of the transistors of a ROM memory array on a first stratum and a second portion of the transistors of the ROM memory array on a second stratum. Within a single 3D device the bonding may be implemented with a combination of micropad connections and through substrate vias (TSVs).

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A programmable read only memory, comprising:
    a first stratum including functional active devices and at least one non-programmed active device;
    a second stratum including at least conductive routing to be associated with the at least one non-programmed active device; and
    bonded programmable inter-strata connections for coupling the first stratum to the second stratum, the bonded programmable inter-strata connections further comprising bonded micropad connections and including at least one bonded programmable inter-strata connection for programming the at least one non-programmed active device and for associating the conductive routing with the at least one non-programmed active device.

2. The programmable read only memory of claim 1, wherein the functional active devices further comprise:
    a plurality of column select transistors;
    a plurality of word line drivers; and
    sense amplifiers.

3. The programmable read only memory of claim 2 wherein the at least one non-programmed active device further comprise:
    an array of transistors located in the first stratum and forming a plurality of rows and columns, each transistor in the array of transistors having one current electrode that is electrically unconnected.

4. The programmable read only memory of claim 1, wherein the at least one bonded programmable inter-strata connection comprises a closed programmable inter-strata connection or an open programmable inter-strata connection.

5. The programmable read only memory of claim 4, further wherein the closed programmable inter-strata connection represents a first logic state and the open programmable inter-strata connection represents a second logic state, the second logic state being different from the first logic state.

6. The programmable read only memory of claim 4, further wherein the closed programmable inter-strata connection includes a presence of a micropad connection and wherein an open programmable inter-strata connection includes an absence of the micropad connection at a bonding interface.

7. The programmable read only memory of claim 1, wherein the bonded micropad connection includes one selected from (i) a $Cu_3Sn$ alloy bond, (ii) a Cu—Cu bond, and (iii) a Au—Au bond.

8. The programmable read only memory of claim 1, wherein the first stratum comprises a semiconductor wafer or a semiconductor die and wherein the second stratum comprises a semiconductor wafer or a semiconductor die.

9. The programmable read only memory of claim 1, further wherein the functional active devices and the at least one non-programmed active device comprise portions of a system on chip.

10. A programmable read only memory, comprising:
a first stratum including functional active devices and at least one non-programmed active device;
a second stratum including at least conductive routing to be associated with the at least one non-programmed active device; and
bonded inter-strata connections for coupling the first stratum to the second stratum, the bonded inter-strata connections including at least one bonded programmable inter-strata connection for programming the at least one non-programmed active device and for associating the conductive routing with the at least one non-programmed active device, wherein the programming of the at least one bonded programmable inter-strata connection is defined by a mask patterning of micropads on one selected from the group consisting of the first stratum, the second stratum, and a combination of both the first stratum and the second stratum.

11. A programmable read only memory, comprising:
a first stratum including functional active devices and at least one non-programmed active device;
a second stratum including at least conductive routing to be associated with the at least one non-programmed active device; and
bonded inter-strata connections for coupling the first stratum to the second stratum, the bonded inter-strata connections including at least one bonded programmable inter-strata connection for programming the at least one non-programmed active device and for associating the conductive routing with the at least one non-programmed active device, wherein at least one of the first stratum and the second stratum comprises a substrate having at least one through substrate via, and wherein the at least one bonded programmable inter-strata connection further comprises either (i) a closed programmable inter-strata connection formed by a bonded micropad and through substrate via, or (ii) an open programmable inter-strata connection formed by an absence of a micropad and through substrate via at a bonding interface.

12. The programmable read only memory of claim 11, further wherein the first stratum comprises the substrate having the at least one through substrate via coupled to the at least one non-programmed active device, and wherein the at least one bonded programmable inter-strata connection further comprises the at least one non-programmed active device being programmed with use of the bonded micropad and the through substrate via.

13. The programmable read only memory of claim 11, further wherein the second stratum comprises the substrate having the at least one through substrate via coupled to the conductive routing, and wherein the at least one bonded programmable inter-strata connection further includes conductive material for programming the at least one non-programmed active device and for connecting the conductive routing to the non-programmed active device with the at least one through substrate via.

14. A programmed storage device comprising:
a first stratum comprising functional active devices and at least one non-programmed active device;
a second stratum comprising at least conductive routing to be associated with the at least one non-programmed active device; and
bonded inter-strata connections for coupling the first stratum to the second stratum, the bonded inter-strata connections comprising at least one bonded programmable inter-strata connection for programming the at least one non-programmed active device and for associating the conductive routing with the at least one non-programmed active device, wherein the at least one bonded programmable inter-strata connection comprises one of a closed programmable inter-strata connection and an open programmable inter-strata connection, further wherein the closed programmable inter-strata connection represents a first logic state and the open programmable inter-strata connection represents a second logic state, the second logic state being different from the first logic state, still further wherein the closed programmable inter-strata connection includes a presence of a micropad connection and wherein an open programmable inter-strata connection includes an absence of the micropad connection at a bonding interface, and wherein the first stratum comprises at least one of a semiconductor wafer and a semiconductor die and wherein the second stratum comprises at least one of a semiconductor wafer and a semiconductor die.

* * * * *